(12) United States Patent
Kojima et al.

(10) Patent No.: US 7,176,098 B2
(45) Date of Patent: Feb. 13, 2007

(54) SEMICONDUCTOR ELEMENT AND METHOD FOR FABRICATING THE SAME

(75) Inventors: Keisuke Kojima, Toyama (JP); Toshiharu Tanbo, Kyoto (JP); Keiichi Murayama, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 95 days.

(21) Appl. No.: 11/062,851

(22) Filed: Feb. 23, 2005

(65) Prior Publication Data

US 2005/0199911 A1    Sep. 15, 2005

(30) Foreign Application Priority Data

Mar. 10, 2004   (JP) ............... 2004-066688

(51) Int. Cl.
*H01L 21/331* (2006.01)
*H01L 21/8222* (2006.01)

(52) U.S. Cl. ............ 438/312; 438/314; 438/317; 438/318

(58) Field of Classification Search ........... 438/312, 438/313–318
See application file for complete search history.

(56) References Cited

U.S. PATENT DOCUMENTS 5,409,846 A    4/1995   Hirose
5,411,632 A *  5/1995   Delage et al. ............ 438/704
6,191,021 B1 * 2/2001   Fuller et al. ............. 438/606
6,806,129 B1 * 10/2004  McHugo et al. .......... 438/205
6,841,795 B2 * 1/2005   Taylor et al. .............. 257/14
6,858,509 B2 * 2/2005   Delage et al. ............ 438/315
6,998,320 B2 * 2/2006   Krueger et al. ........... 438/312

FOREIGN PATENT DOCUMENTS

JP        6-232148        8/1994

* cited by examiner

*Primary Examiner*—Michael Lebentritt
*Assistant Examiner*—Angel Roman
(74) *Attorney, Agent, or Firm*—McDermott Will & Emery LLP (57) ABSTRACT

A heterojunction bipolar transistor comprises a collector layer, a base layer formed on the collector layer and an emitter layer formed on the base layer. The emitter layer includes a first semiconductor layer covering the entire top surface of the base layer and a second semiconductor layer formed on a predetermined part of the first semiconductor layer. An inactivated region is formed, by ion implantation, in a region of the collector layer located below the base layer except for a part thereof corresponding to the second semiconductor layer. The edge of the inactivated region is located away from the edge of the second semiconductor layer, and a region of the first semiconductor layer between the edge of the inactivated region and the edge of the second semiconductor layer is depleted.

10 Claims, 8 Drawing Sheets

SEMICONDUCTOR ELEMENT AND METHOD FOR FABRICATING THE SAME

CROSS-REFERENCE TO RELATED APPLICATIONS

This application claims priority under 35 U.S.C. §119 on Patent Application No. 2004-66688 filed in Japan on Mar. 10, 2004, the entire contents of which are hereby incorporated by reference.

BACKGROUND OF THE INVENTION

1. Field of the Invention

The present invention relates to a heterojunction bipolar transistor (hereinafter, referred to as "HBT") using a substrate formed with an epitaxial layer and a method for fabricating the same.

2. Description of Related Art

In order to realize a high-performance HBT, a process has been conventionally used in which a part of a collector region of a HBT located immediately below a base region thereof is inactivated by ion implantation to reduce the parasitic base-to-collector capacitance.

However, in the above-mentioned process, respective crystallinities of an emitter layer and a base layer and the crystallinity of the interface between the emitter layer and the base layer are damaged, resulting in deteriorated transistor characteristics (current amplification factor hFE=collector current/base current). The reason for this is that dopant ions implanted into the emitter surface passes through the base region and reaches the collector region.

On the other hand, in a method developed by Yamaguchi (Fujitsu Limited) (see Japanese Unexamined Patent Publication No. 6-232148), the formation of a sidewall made of an oxide film on the side of an emitter prevents the occurrence of the above-mentioned problem.

SUMMARY OF THE INVENTION

However, the use of the method disclosed in Japanese Unexamined Patent Publication No. 6-232148 inevitably increases the number of process steps, resulting in increased production cost. The reason for this is that the method need include the steps of forming an oxide film sidewall to prevent damage due to ion implantation and removing the oxide film sidewall after ion implantation.

In view of the above, an object of the present invention is to realize a high-performance HBT that reduces the base-to-collector capacitance by ion implantation and prevents transistor characteristics from being deteriorated without increasing the number of process steps.

After various studies, the present inventors found that the above object can be achieved by simply adding an easy process step of forming an inactivated region in a collector layer using ion implantation and then etching the side of an emitter (hereinafter, referred to as "side-etching"). The reason why they found the above will be described hereinafter.

In order to enhance the maximum oscillation frequency of HBTs, ion implantation or an n/i-type collector layer has been conventionally used to reduce the base-to-collector capacitance. Although the ion implantation allows a part of a collector layer located immediately below a base to be depleted, it produces a trap center at an implantation edge (the edge of a region into which ions are implanted) located at the interface between an emitter layer and a base layer. As a result, during transistor action, when carriers injected from a base electrode pass through the base layer and reaches the emitter layer, about a few percents of the carriers are captured in the trap center. In view of the above, in order to continue the transistor action, a base current is required to compensate for the captured carriers, i.e., losses of the base current are produced, resulting in reduced hFE.

The present inventors paid attention to the fact that, in order to suppress reduction in this hFE, it is significant to separate a current path leading to an emitter from a trap having the trap center. Thus, they found that when a part of a HBT between an emitter edge (the edge of a part of the emitter layer substantially functioning as an emitter) and the implantation edge is depleted by separating the emitter edge from the implantation edge, a current path leading to the trap part can be blocked. It should be considered that the interruption of the current path leading to the trap part allows most of the carriers injected from the base electrode to pass through the base layer and reach the emitter layer.

The separation of the emitter edge from the implantation edge can be achieved by side-etching the emitter, i.e., removing the sidewalls of the emitter using wet etching or dry etching. However, if the above-mentioned separation, i.e., processing of the emitter shape is carried out by dry etching, a newly formed emitter edge surface suffers damage due to dry etching, leading to increased leakage current from a base to the emitter. To cope with this, the damaged emitter edge region due to dry etching can be removed by subjecting the emitter edge surface to wet etching after dry etching, resulting in reduced leakage current.

The present invention is made on the basis of the above-mentioned finding, and more specifically, a heterojunction bipolar transistor of the present invention comprises a collector layer, a base layer formed on the collector layer and an emitter layer formed on the base layer, wherein the emitter layer includes a first semiconductor layer covering the entire top surface of the base layer and a second semiconductor layer formed on a predetermined part of the first semiconductor layer, an inactivated region is formed, by ion implantation, in a region of the collector layer located below the base layer except for a part thereof corresponding to the second semiconductor layer, the edge of the inactivated region is located away from the edge of the second semiconductor layer, and a region of the first semiconductor layer between the edge of the inactivated region and the edge of the second semiconductor layer is depleted.

According to the present invention, a method for fabricating a heterojunction bipolar transistor comprising a collector layer, a base layer formed on the collector layer and an emitter layer formed on the base layer, comprises the steps of: successively forming a first semiconductor layer and a second semiconductor layer both constituting the emitter layer on the base layer; patterning the second semiconductor layer into a predetermined shape; forming an inactivated region by implanting ions into the collector layer except for a part of the collector layer corresponding to the second semiconductor layer; and side-etching the patterned second semiconductor layer to locate the edge of the second semiconductor layer away from the edge of the inactivated region and depleting a region of the first semiconductor layer between the edge of the second semiconductor layer and the edge of the inactivated region.

According to the present invention, the inactivated region is formed in a collector region located immediately below a base by ion implantation. Therefore, the base-to-collector capacitance can be reduced and thus a high-performance HBT can be realized. Furthermore, since the edge of the second semiconductor layer constituting a part of the emitter layer (emitter edge) is located away from the edge of the inactivated region (implantation edge), the following effect can be obtained. Carriers moving from a base electrode to an emitter electrode can be prevented from being captured in a trap level produced at the interface between the first semiconductor layer (a part of the emitter layer) and the base layer due to damage resulting from ion implantation for forming the inactivated region. This can prevent deterioration in transistor characteristics, i.e., hFE. Furthermore, since the emitter edge can be separated from the implantation edge by simply side-etching the second semiconductor layer constituting a part of the emitter layer, a high-performance HBT can be realized without increasing the number of process steps.

In other words, according to the present invention, when a part of the collector layer is inactivated by ion implantation to reduce the parasitic collector-to-base capacitance, the emitter edge is separated from the implantation edge by adding a simple step of side-etching the emitter. As a result, deterioration in the current amplification factor hFE can be prevented. Therefore, a high-performance HBT that is not deteriorated in transistor characteristics can be fabricated at low cost. In summary, the present invention relates to a HBT and a method for fabricating the same and when it is applied to a HBT having the base-to-collector capacitance reduced by ion implantation, increase in the number of process steps and deterioration in transistor characteristics can be avoided. Therefore, the present invention is useful.

In the present invention, the distance between the emitter edge and the implantation edge is preferably 0.1 μm or more. This ensures the above-mentioned effect. Furthermore, the distance between the emitter edge and the implantation edge is preferably 0.4 μm or less. This provides the effect of recovering hFE.

DETAILED DESCRIPTION OF THE INVENTION

A heterojunction bipolar transistor (HBT) according to an embodiment of the present invention and a method for fabricating the same will be described hereinafter with reference to the drawings.

Figure 1:
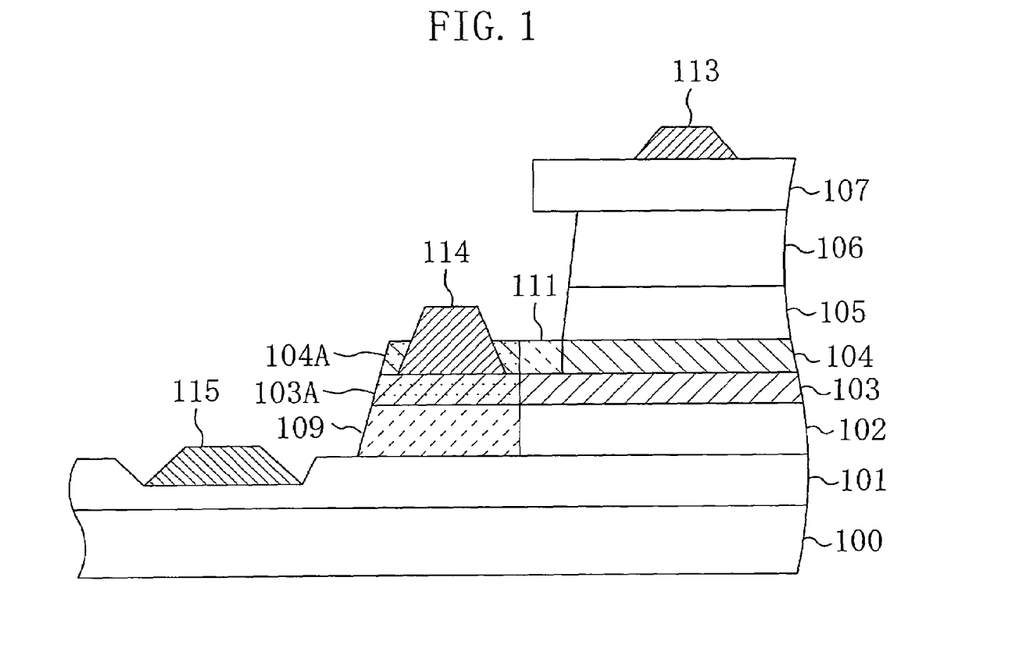
FIG. 1 is a cross-sectional view showing the structure of a heterojunction bipolar transistor according to an embodiment of the present invention.

FIG. 1 is a cross-sectional view showing the structure of the HBT according to this embodiment. As shown in FIG. 1, a first collector layer 101, for example, made of a heavily Si-doped n-type ($n^+$-type) GaAs layer is formed on a semi-insulating substrate 100, for example, made of GaAs. The following layers are successively formed on the first collector layer 101 to expose a region of the first collector layer 101 on which a collector electrode is formed: a second collector layer 102, for example, made of a Si-doped n-type GaAs layer; a base layer 103, for example, made of a C-doped p-type GaAs layer; and a first emitter layer 104, for example, made of a Si-doped $In_{0.48}GaP$ layer. The following layers are successively formed on the first emitter layer 104 to expose a region of the first emitter layer 104 in which a base electrode is to be formed: a second emitter layer 105, for example, made of a Si-doped n-type GaAs layer; a contact layer 106, for example, made of a Se-doped $n^+$-type $In_{0.5}GaAs$ layer; and a WSi emitter layer 107. In this relation, the edge of the WSi emitter layer 107 located to the base electrode side overhangs beyond a multilayer structure of the second emitter layer 105 and the contact layer 106. An emitter electrode 113 is formed on the WSi emitter layer 107 to have, for example, a Pt/Ti/Pt multilayer structure (in which a Pt layer, a Ti layer and a Pt layer are stacked in bottom-to-top order). A base electrode 114 is formed on a region of the base layer 103 on which the base electrode is to be formed (hereinafter, referred to as "base electrode formation region") to pass through the first emitter layer 104, reach the base layer 103 and have, for example, a Pt/Ti/Pt multilayer structure. A collector electrode 115 is formed on a region of the first collector layer 101 on which the collector electrode is to be formed to have, for example, an AuGe/Ni/Au multilayer structure (in which an AuGe layer, a Ni layer and an Au layer are stacked in bottom-to-top order).

An inactivated region 109 is formed in a region of the second collector layer 102 located below the base electrode 114 by ion implantation. Damaged regions 103A and 104A due to the above ion implantation are formed in respective regions of the base layer 103 and the first emitter layer 104 located immediately above the inactivated region 109.

This embodiment is characterized in that the edge of the inactivated region 109 is located away from the edge of the second emitter layer 105 (emitter edge), i.e., the edge of the damaged region 104A (implantation edge) is located away from the edge of the second emitter layer 105 (emitter edge). This allows a region of the first emitter layer 104 between the implantation edge and the emitter edge to be exposed to the atmosphere, resulting in this region being depleted (losing carriers). Therefore, a depletion region (in this embodiment, depleted InGaP layer region) 111 is formed therein.

In this case, the thickness of an InGaP layer constituting the first emitter layer 104 is preferably limited to 80 nm or less such that the depletion region 111 is formed to extend from top to bottom of the first emitter layer 104. Furthermore, in this case, the thickness of the Pt layer, i.e., the lowest layer of the base electrode 114, is preferably set at 40 nm or more. It is needless to say that when materials different from those of this embodiment are used as respective materials of the first emitter layer 104 and the base electrode 114, an upper limit of the thickness of the first emitter layer 104 and a lower limit of the thickness of the lowest layer of the base electrode 114 are to be determined in accordance with the materials to be used.

An example of a method for fabricating a HBT of this embodiment shown in FIG. 1 will be described hereinafter. FIGS. 2A, 2B, 3A, 3B, 4A, and 4B are cross-sectional views showing process steps of the method for fabricating the HBT according to this embodiment.

Figure 2A:
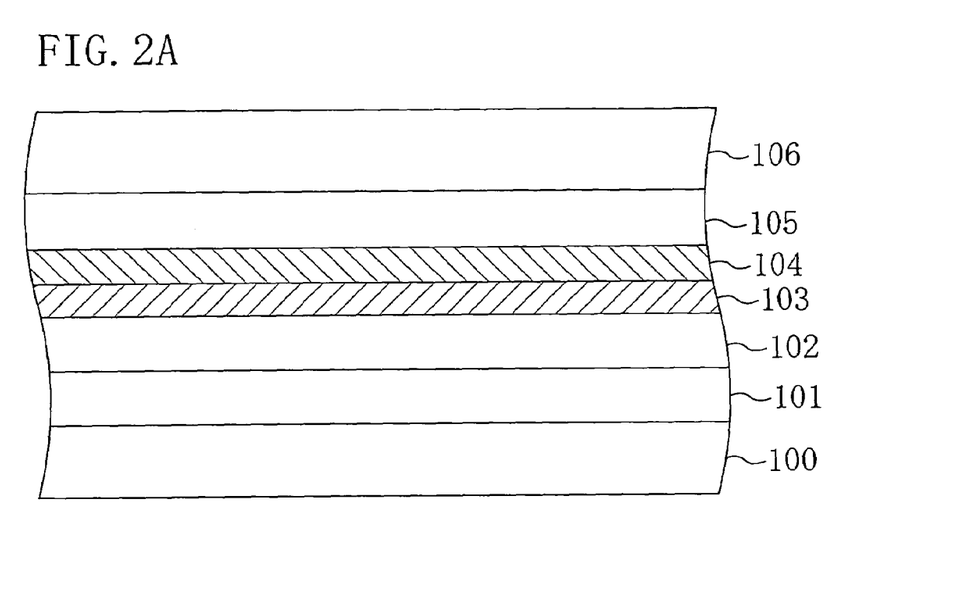
FIGS. 2A and 2B are cross-sectional views showing some of process steps of a method for fabricating a heterojunction bipolar transistor according to the embodiment of the present invention.

First, as shown in FIG. 2A, the following layers are successively formed on a semi-insulating substrate 100, for example, made of GaAs, by metal organic chemical vapor deposition (MOCVD) or other methods: a first collector layer 101, for example, made of a Si-doped n$^+$-type GaAs layer; a second collector layer 102, for example, made of a Si-doped n-type GaAs layer; a base layer 103, for example, made of a C-doped p-type GaAs layer; a first emitter layer 104, for example, made of a Si-doped In$_{0.48}$GaP layer; a second emitter layer 105, for example, made of a Si-doped n-type GaAs layer; and a contact layer 106, for example, made of a Se-doped n$^+$-type In$_{0.5}$GaAs layer. Subsequently, an approximately 100-nm-thick WSi emitter layer 107 is entirely formed on the semi-insulating substrate 100 region by sputtering.

Figure 2B:
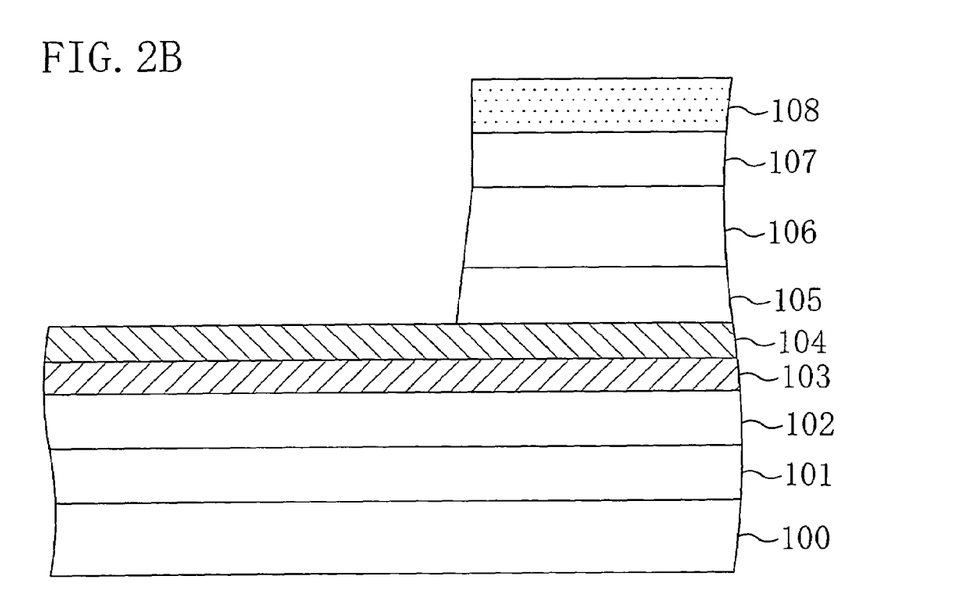

Next, as shown in FIG. 2B, the WSi emitter layer 107 is subjected to dry etching using, for example, a mixed gas of a CF$_4$ gas and a SF$_6$ gas by using, as a mask, a resist pattern 108 covering a region in which an emitter is to be formed (hereinafter, referred to "emitter formation region"). Subsequently, the contact layer 106 and the second emitter layer 105 are subjected to dry etching using, for example, a mixed gas of a SiCl$_4$ gas, a SF$_6$ gas and a N$_2$ gas by using the resist pattern 108 as a mask. An emitter region of the HBT can be formed in the above-mentioned manner.

Figure 3A:
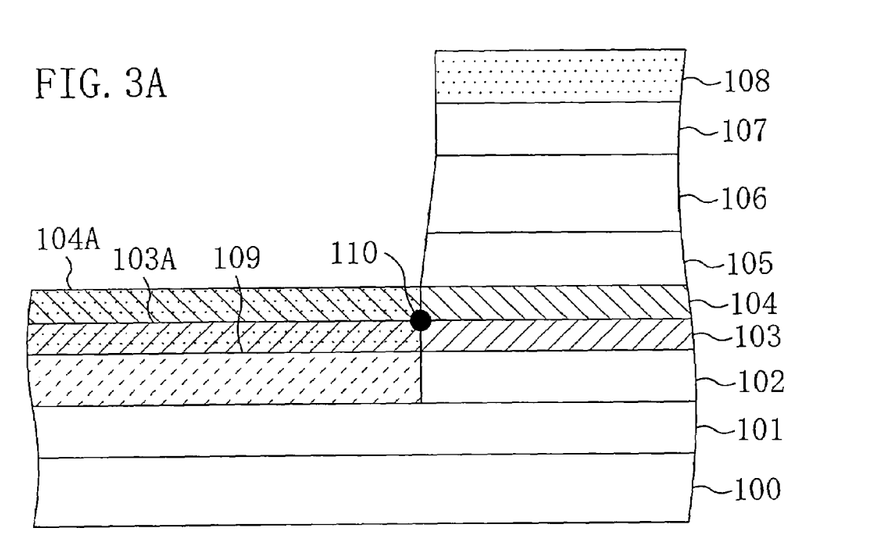
FIGS. 3A and 3B are cross-sectional views showing some of the process steps of the method for fabricating a heterojunction bipolar transistor according to the embodiment of the present invention.

Next, as shown in FIG. 3A, helium (He) ions are implanted into the first emitter layer 104, the base layer 103 and the second collector layer 102, for example, under ion implantation conditions of an acceleration voltage of 100 KeV and a dose of $2.0 \times 10^{11}$ cm$^{-2}$ by using, as a mask, the resist pattern 108 used to form an emitter. Thus, the He ions pass through the first emitter layer (InGaP layer) 104 and the base layer (p$^+$-type GaAs layer) 103 and reach the second collector layer (n-type GaAs layer) 102. As a result, an inactivated region 109 is formed therein. Damage to crystals produces a trap level in the inactivated region 109, leading to carriers trapped in the trap level. Damaged regions 103A and 104A are formed in respective regions of the base layer 103 and the first emitter layer 104 located immediately above the inactivated region 109. At this time, an implantation edge located at the interface between the first emitter layer (InGaP layer) 104 and the base layer (p$^+$-type GaAs layer) 103 is formed with a trap level 110 due to damage caused by implantation. This trap level 110 deteriorates transistor characteristics by trapping some of carriers injected from the base electrode. According to the present embodiment, this can be avoided in the manner that will be described later.

Figure 3B:
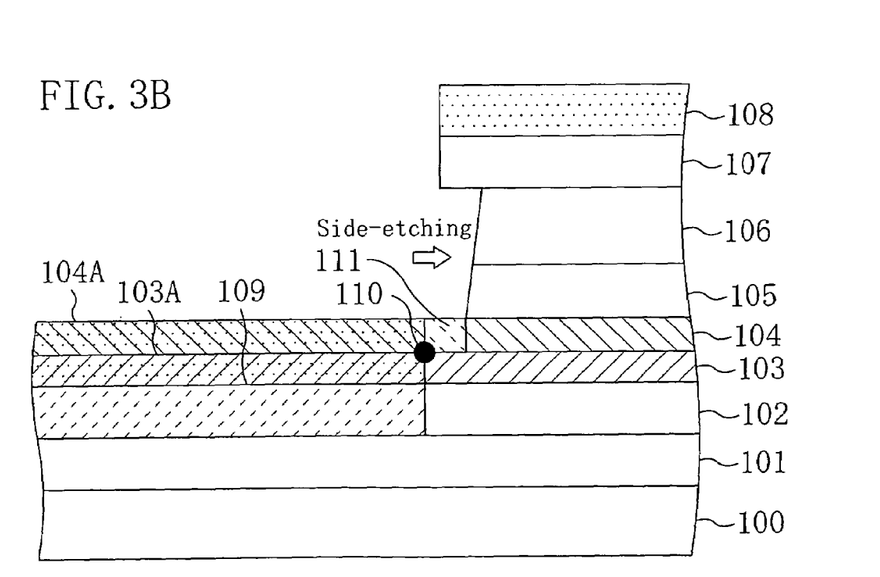

Next, as shown in FIG. 3B, the second emitter layer (n-type GaAs layer) 105 and the contact layer (n$^+$-type In$_{0.5}$GaAs layer) 106 are subjected to wet etching using, for example, a mixed solution of phosphoric acid, a hydrogen peroxide solution and water by using, as a mask, the resist pattern 108 used to form the emitter, where the volume ratio of phosphoric acid, a hydrogen peroxide solution and water is 4:1:90. In this way, the second emitter layer 105 and the contact layer 106 are side-etched to remove the respective sides of the layers 105 and 106 by a predetermined thickness. As a result, the top surface of an InGaP layer region of the first emitter layer 104 except for the damaged region 104A is newly exposed. Thus, the newly exposed region becomes a depletion region 111. The edge of the inactivated region 109 is located away from the edge of the second emitter layer 105 (emitter edge), i.e., the edge of the damaged region 104A (implantation edge) is located away from the edge of the second emitter layer 105 (emitter edge).

Figure 4A:
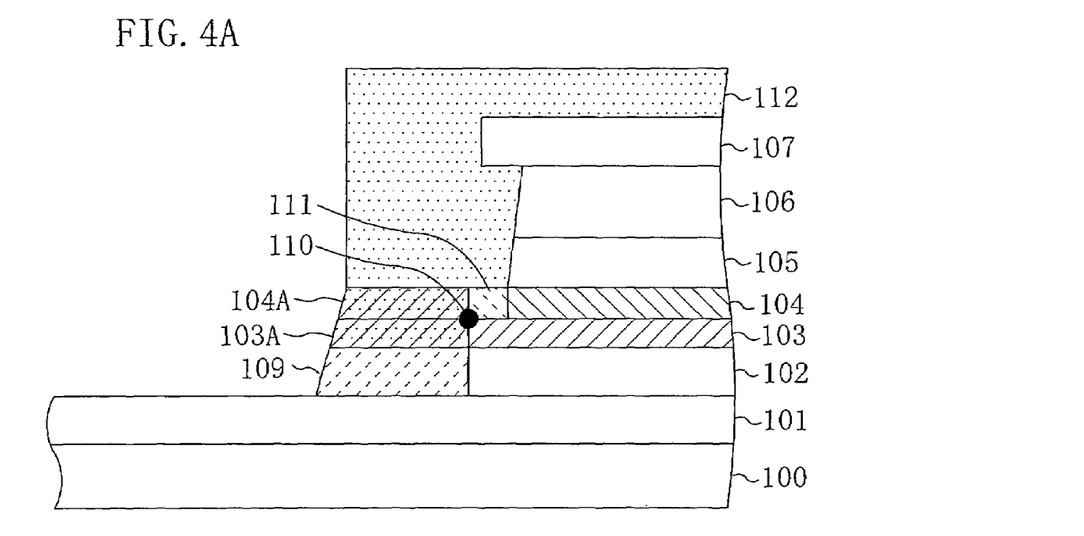
FIGS. 4A and 4B are cross-sectional views showing some of the process steps of the method for fabricating a heterojunction bipolar transistor according to the embodiment of the present invention.

Next, as shown in FIG. 4A, the first emitter layer 104, the base layer 103 and the second collector layer 102 are subjected to dry etching using, for example, a mixed gas of a CF$_4$ gas and a SF$_6$ gas by using, as a mask, a resist pattern 112 covering a region in which a base is formed (hereinafter, referred to as "base formation region") and the emitter formation region, thereby forming a base region of the HBT.

Figure 4B:
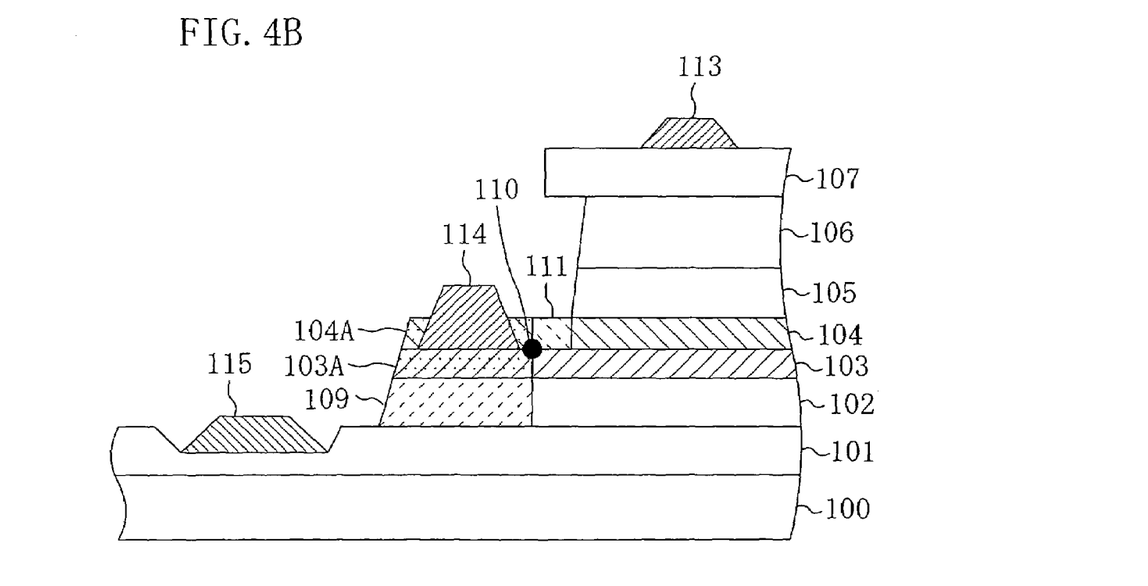

Then, as shown in FIG. 4B, for example, Pt/Ti/Pt multilayer structures that will be an emitter electrode 113 and a base electrode 114 are formed on the WSi emitter layer 107 and in a region of the first emitter layer 104 in which a base electrode is to be formed (in this embodiment, the damaged region 104A), respectively, for example, by resistance heating evaporation and lift-off. For example, an AuGe/Ni/Au multilayer structure that will be a collector electrode 115 is separately formed on a region of the first collector layer 101 on which a collector electrode is formed (hereinafter, referred to as "collector electrode formation region"), for example, by resistance heating evaporation and lift-off.

After the formation of each metal multilayer structure, the metal multilayer structure is annealed, for example, in a nitrogen (N$_2$) atmosphere at 380° C. for 120 seconds. In this way, Pt atoms of the Pt layer constituting a part of the Pt/Ti/Pt multilayer structure that will be the base electrode 114 and making contact with the first emitter layer (InGaP layer) 104 diffuse into the InGaP layer 104 and reach the base layer (p-type GaAs layer) 103. As a result, an ohmic junction is formed therein. Furthermore, alloying reaction is caused between the AuGe/Ni/Au multilayer structure that will be the collector electrode 115 and the first collector layer (n$^+$-type GaAs layer) 101. As a result, an ohmic junction is again formed therein. In this manner, a HBT is completed which is formed with the emitter electrode 113, the base electrode 114 and the collector electrode 115.

Figure 8:
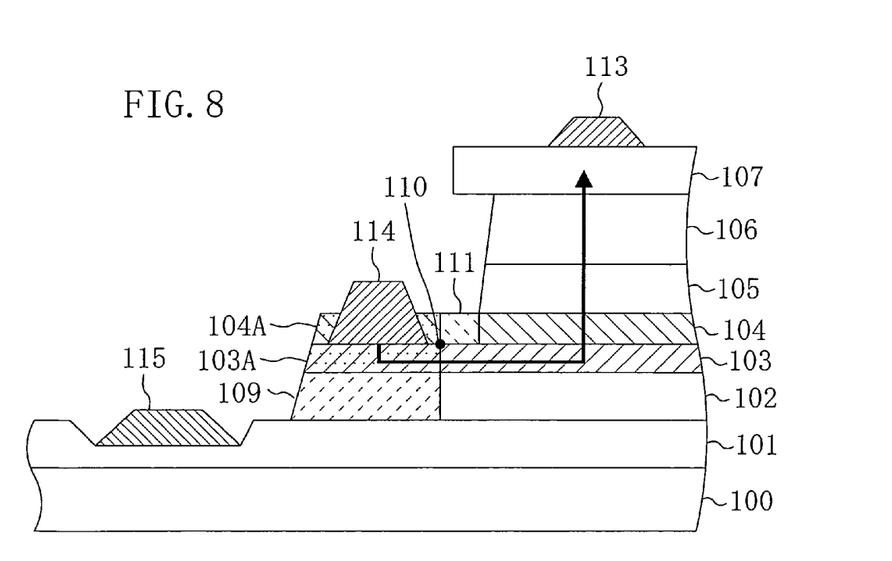
FIG. 8 is a diagram showing the current flow from a base electrode to an emitter electrode in the heterojunction bipolar transistor according to the embodiment of the present invention.
Figure 10:
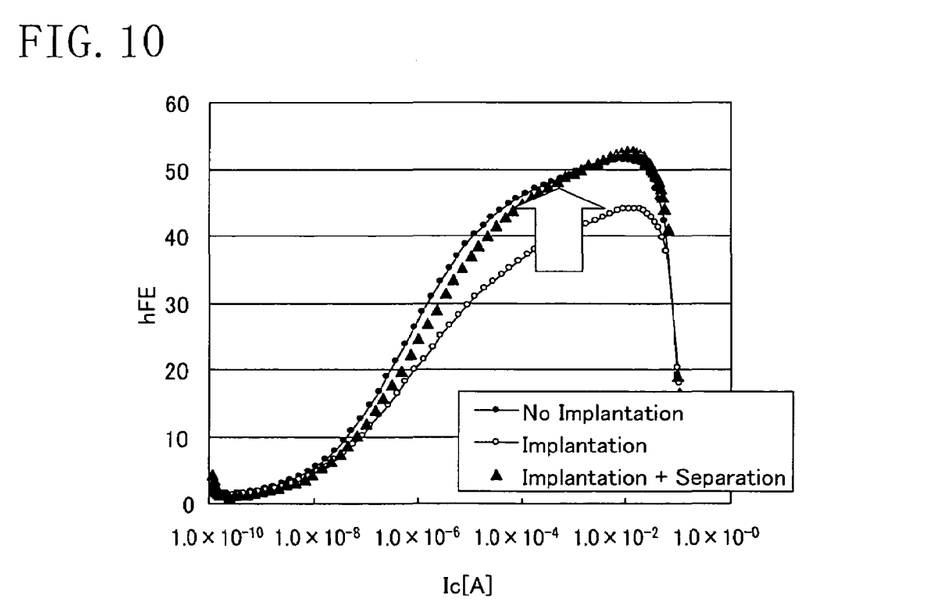
FIG. 10 is a graph showing the effect of preventing hFE from being deteriorated in the heterojunction bipolar transistor according to the embodiment of the present invention.

As described above, according to this embodiment, the inactivated region 109 is formed in the second collector layer 102 located immediately below the base layer 103 by ion implantation. Therefore, the base-to-collector capacitance can be reduced and thus a high-performance HBT can be realized. Furthermore, since the edge of the second emitter layer 105 (emitter edge) is located away from the edge of the inactivated region 109 (implantation edge), the following effect can be obtained. A current path is blocked which leads to the trap level 110 produced at the implantation edge (the respective edges of the damaged regions 103A and 104A) located at the interface between the first emitter layer 104 and the base layer 103 is blocked. The reason for this is that the separation of the emitter edge from the implantation edge allows an InGaP region of the first emitter layer 104 between the implantation edge and the emitter edge to be depleted, thereby forming the depletion region 111 in the InGaP region of the first emitter layer 104. It is considered that during transistor action, the blockage of the current path allows most of carriers injected from the base electrode 114 to pass through the base layer (p$^+$-type GaAs layer) 103 and reach the emitter layers 104 and 105 as shown in FIG. 8 in which the arrow indicates the flow of carriers (current flow). This can prevent transistor characteristics, i.e., hFE, from being deteriorated as shown in FIG. 10. Referring to FIG. 10, the axis of ordinates indicates a collector current $I_C$ and the axis of ordinates indicates hFE. In FIG. 10, "No Implantation" means the case where in this embodiment neither of "ion implantation for forming the inactivated region 109" and "side-etching for separating the emitter edge from the implantation edge" is carried out. "Implantation" means the case where in this embodiment "ion implantation for forming the inactivated region 109" is carried out but "side-etching for separating the emitter edge from the implantation edge" is not carried out. Furthermore, "Implantation+Separation" means the case where the method of this embodiment is carried out, i.e., the case where both of "ion implantation for forming the inactivated region 109" and "side-etching for separating the emitter edge from the implantation edge" are carried out. As shown in FIG. 10, according to this embodiment, although hFE is reduced by "ion implantation for forming the inactivated region 109", the reduction in hFE can be compensated for by "side-etching for separating the emitter edge from the implantation edge".

Since in this embodiment the emitter edge can be separated from the implantation edge by simply side-etching the second emitter layer 105, a high-performance HBT can be realized without increasing the number of process steps.

Although in this embodiment He ions are implanted into the second collector layer 102 to form the inactivated region 109, H (hydrogen) or B (boron) ions may alternatively be implanted thereinto.

In this embodiment, a mixed gas of a SiCl$_4$ gas, a SF$_6$ gas and a N$_2$ gas is used for dry etching intended to pattern the second emitter layer 105 into an emitter shape. However, another etching gas, for example, a mixed gas of an Ar gas and a Cl$_2$ gas, may alternatively be used for the drying etching.

In this embodiment, an etchant containing phosphoric acid, a hydrogen peroxide solution and water is used for wet etching intended to side-etch the second emitter layer 105. However, another etchant, for example, an etchant containing ammonium citrate, a hydrogen peroxide solution and water may alternatively be used for the wet etching.

In this embodiment, instead of wet etching, dry etching is used to side-etch the second emitter layer 105. In this case, dry etching may be carried out, for example, using an etching gas containing a SiCl$_4$ gas and a SF$_6$ gas.

However, when dry etching is used to side-etch the second emitter layer 105, a newly formed edge surface of the emitter is damaged by dry etching. This damage causes increase in leakage current from the base to the emitter. To cope with this, after dry etching, wet etching is performed with respect to the emitter edge surface. As a result, the damaged region due to dry etching can be removed, resulting in suppressed leakage current. Therefore, excellent HBT characteristics can be achieved.

In this embodiment, the edge of the inactivated region 109 (implantation edge) is preferably located 0.1 μm or more away from the edge of the second emitter layer 105 (emitter edge). This ensures the above-mentioned effect. Furthermore, the distance between the emitter edge and the implantation edge is preferably 0.4 μm or less. This provides the effect of recovering hFE.

In this embodiment, the base electrode 114 is formed on the base electrode formation region of the base layer 103 to pass through the first emitter layer 104 and reach the base layer 103. Alternatively, the base electrode 114 may be formed directly on the base layer 103 by selectively removing a part of the first emitter layer 104 located on the base electrode formation region of the base layer 103. In this case, caution must be used not to remove the depletion region 111.

It is needless to say that in this embodiment, respective materials of a substrate, semiconductor layers and electrodes constituting a HBT are not particularly restrictive.

COMPARATIVE EXAMPLE

A description will be given below of, as a comparative example, a HBT in which an emitter edge is not separated from an implantation edge and a method for fabricating the same and their characteristics with reference to the drawings.

FIGS. 5A, 5B, 6A and 6B are cross-sectional views showing process steps of a method for fabricating a HBT according to the comparative example.

Figure 5A:
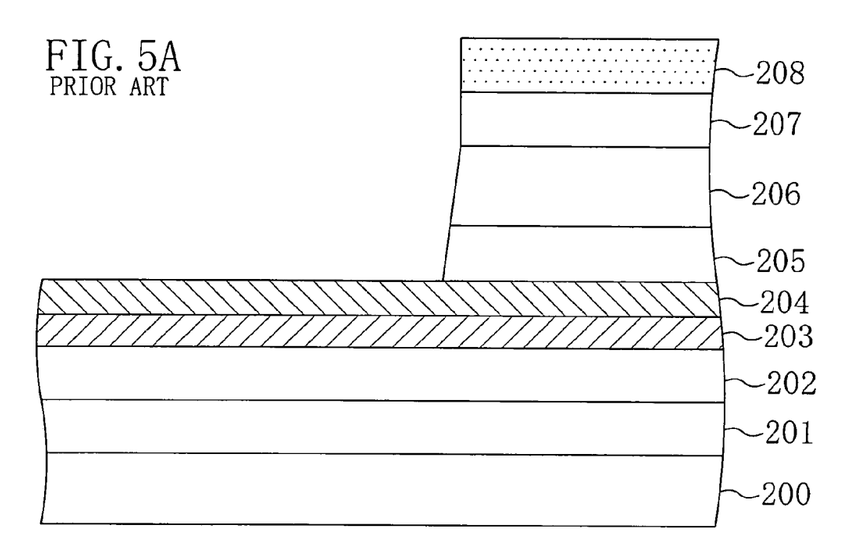
FIGS. 5A and 5B are cross-sectional views showing some of process steps of a method for fabricating a heterojunction bipolar transistor according to a comparative example.

First, as shown in FIG. 5A, the following layers are successively formed on a semi-insulating substrate 200, for example, made of GaAs, by MOCVD or other methods: a first collector layer 201, for example, made of a Si-doped n$^+$-type GaAs layer; a second collector layer 202, for example, made of a Si-doped n-type GaAs layer; a base layer 203, for example, made of a C-doped p-type GaAs layer; a first emitter layer 204, for example, made of a Si-doped In$_{0.48}$GaP layer; a second emitter layer 205, for example, made of a Si-doped n-type GaAs layer; and a contact layer 206, for example, made of a Se-doped n$^+$-type In$_{0.5}$GaAs layer. Subsequently, an approximately 100-nm-thick WSi emitter layer 207 is entirely formed on the semi-insulating substrate 200 region by sputtering. Thereafter, the WSi emitter layer 207, the contact layer 206 and the second emitter layer 205 are subjected to dry etching using, for example, a mixed gas of a CF$_4$ gas and a SF$_6$ gas by using, as a mask, a resist pattern 208 covering an emitter formation region of the HBT. An emitter region of the HBT is formed in the above-mentioned manner.

Figure 5B:
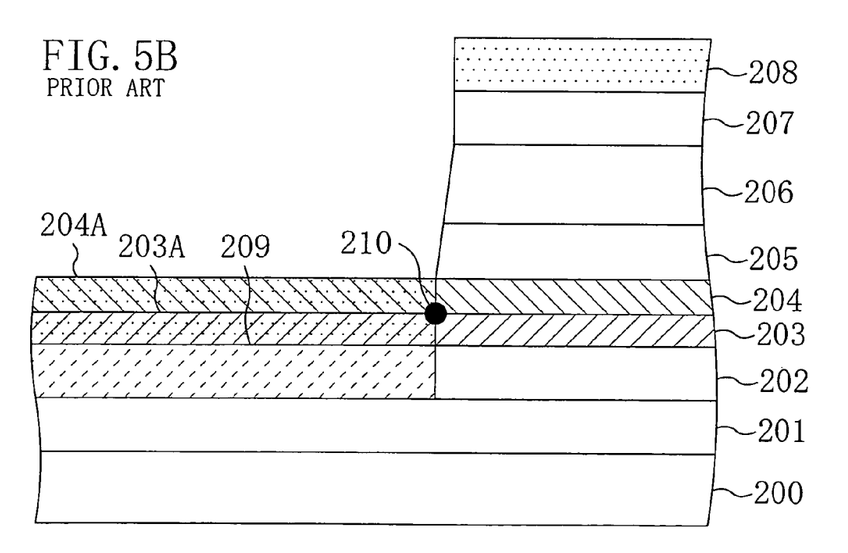

As shown in FIG. 5B, helium (He) ions are implanted into the first emitter layer 204, the base layer 203 and the second collector layer 202, for example, under ion implantation conditions of an acceleration voltage of 100 KeV and a dose of $2.0 \times 10^{11}$ cm$^{-2}$ by using, as a mask, the resist pattern 208 used to form an emitter. Thus, the He ions pass through the first emitter layer (InGaP layer) 204 and the base layer (p$^+$-type GaAs layer) 203 and reach the second collector layer (n-type GaAs layer) 202. As a result, an inactivated region 209 is formed therein. Damage to crystals produces a trap level in the inactivated region 209, leading to carriers trapped in the trap level. Damaged regions 203A and 204A are formed in respective regions of the base layer 203 and the first emitter layer 204 located immediately above the inactivated region 209. At this time, an implantation edge located at the interface between the first emitter layer (InGaP layer) 204 and the base layer (p$^+$-type GaAs layer) 203 is formed with a trap level 210 due to damage caused by implantation. This trap level 210 deteriorates transistor characteristics by trapping some of carriers injected from the base electrode.

Figure 6A:
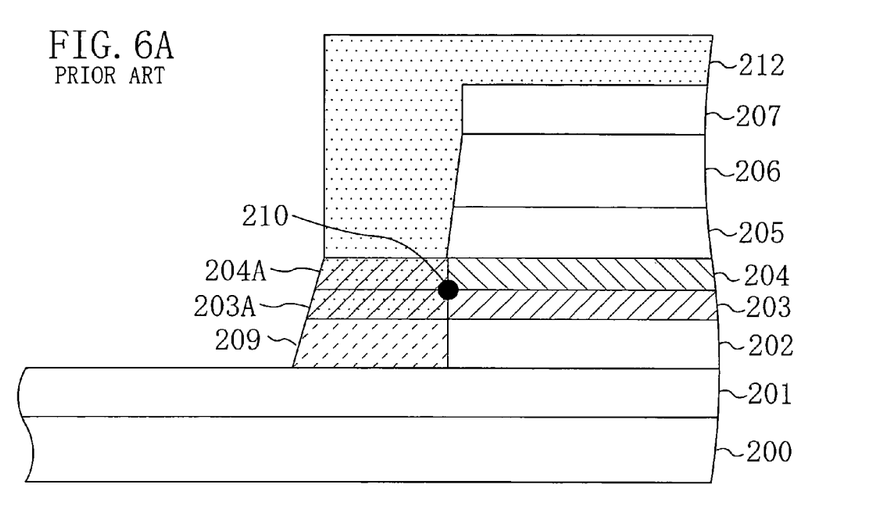
FIGS. 6A and 6B are cross-sectional views showing some of the process steps of the method for fabricating a heterojunction bipolar transistor according to the comparative example.

Next, as shown in FIG. 6A, the first emitter layer 204, the base layer 203 and the second collector layer 202 are subjected to dry etching using, for example, a mixed gas of a $CF_4$ gas and a $SF_6$ gas by using, as a mask, a resist pattern 212 covering a base formation region and the emitter formation region, thereby forming a base region of the HBT.

Figure 6B:
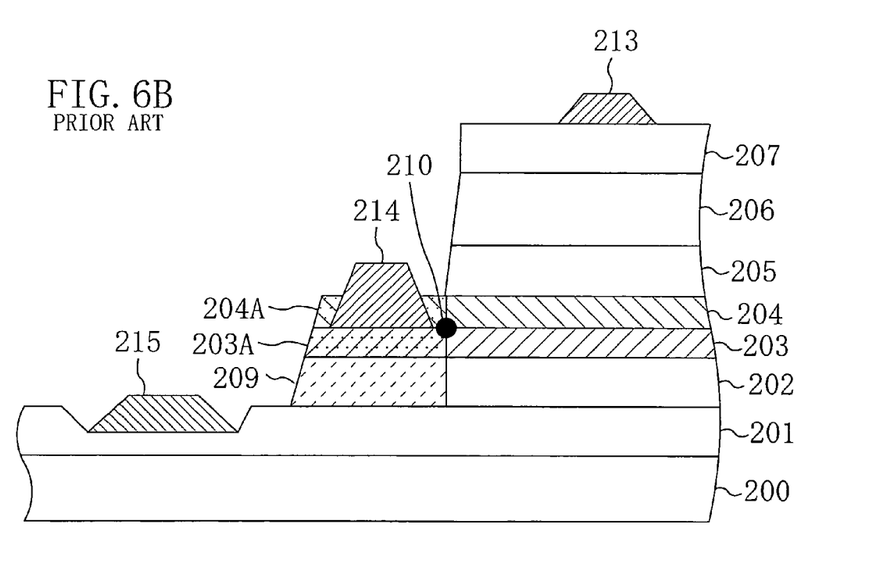

Then, as shown in FIG. 6B, for example, Pt/Ti/Pt multilayer structures that will be an emitter electrode 213 and a base electrode 214 are formed on the WSi emitter layer 207 and in a region of the first emitter layer 204 in which a base electrode is to be formed (in this comparative example, a damaged region 204A), respectively, for example, by resistance heating evaporation and lift-off. For example, an AuGe/Ni/Au multilayer structure that will be a collector electrode 215 is separately formed on a collector electrode formation region of the first collector layer 201, for example, by resistance heating evaporation and lift-off.

After the formation of each metal multilayer structure, the metal multilayer structure is annealed, for example, in a $N_2$ atmosphere at 380° C. for 120 seconds. In this way, Pt atoms of the Pt layer constituting a part of the Pt/Ti/Pt multilayer structure that will be the base electrode 214 and making contact with the first emitter layer (InGaP layer) 204 diffuse into the InGaP layer 204 and reach the base layer (p-type GaAs layer) 203. As a result, an ohmic junction is formed therein. Furthermore, alloying reaction is caused between the AuGe/Ni/Au multilayer structure that will be the collector electrode 215 and the first collector layer ($n^+$-type GaAs layer) 201. As a result, an ohmic junction is again formed therein. In this manner, a HBT is completed which is formed with the emitter electrode 213, the base electrode 214 and the collector electrode 215.

Figure 7:
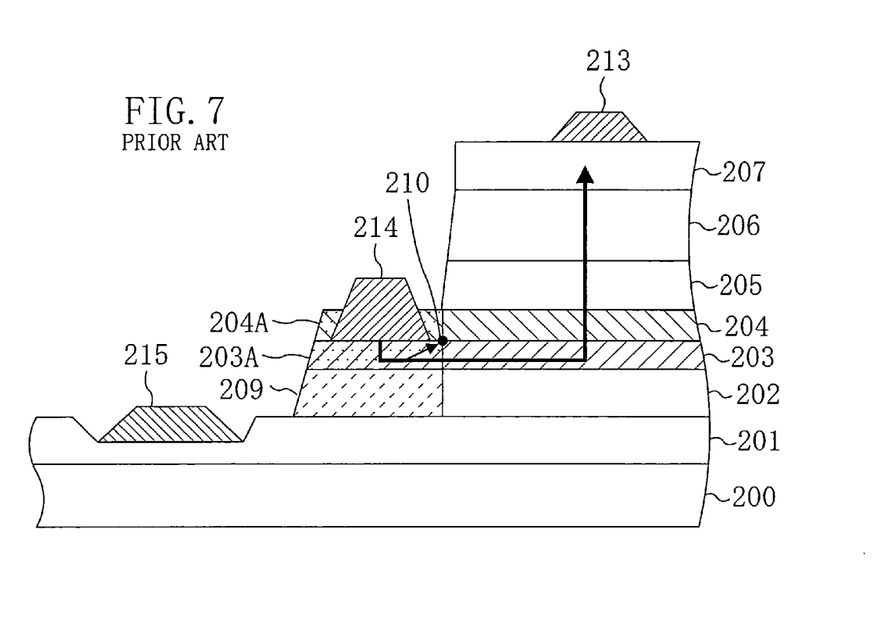
FIG. 7 is a diagram showing the current flow from a base electrode to an emitter electrode in the heterojunction bipolar transistor according to the comparative example.
Figure 9:
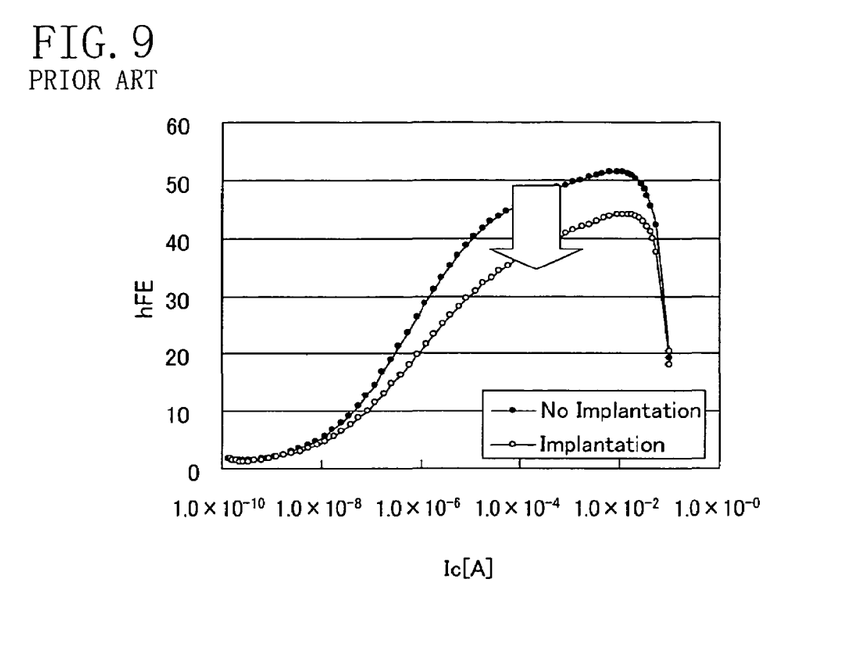
FIG. 9 is a graph showing how much hFE is reduced in the heterojunction bipolar transistor according to the comparative example.

As described above, according to this embodiment, the inactivated region 209 is formed in the second collector layer 202 located immediately below the base layer 203 by ion implantation. Therefore, the base-to-collector capacitance can be reduced. The above-mentioned ion implantation produces a trap level 210 at an implantation edge (the respective edges of the damaged regions 203A and 204A) at the interface between the first emitter layer (InGaP layer) 204 and the base layer ($p^+$-type GaAs layer) 203. As a result, during transistor action, when carriers injected from the base electrode 214 pass through the base layer 203 and reaches the emitter layers 204 and 205, about a few percents of the carriers are captured in the trap level 210 as shown in FIG. 7 in which the arrow shows the flow of carriers (current flow). In view of the above, in order to continue the transistor action, a base current is required to compensate for the captured carriers, i.e., losses of the base current are produced, resulting in reduced hFE as shown in FIG. 9. Referring to FIG. 9, the axis of ordinates indicates a collector current $I_C$ and the axis of ordinates indicates hFE. In FIG. 9, "No Implantation" means the case where in this comparative example "ion implantation for forming the inactivated region 209" is not carried out. "Implantation" means the case where the method of this comparative example is carried out, i.e., "ion implantation for forming the inactivated region 209" is carried out. As shown in FIG. 9, hFE is reduced by "ion implantation for forming the inactivated region 109" according to this comparative example.

What is claimed is:

1. A method for fabricating a heterojunction bipolar transistor comprising a collector layer, a base layer formed on the collector layer and an emitter layer formed on the base layer, said method comprising the steps of:
    successively forming a first semiconductor layer and a second semiconductor layer both constituting the emitter layer on the base layer;
    patterning the second semiconductor layer into a predetermined shape;
    forming an inactivated region by implanting ions into the collector layer except for a part of the collector layer corresponding to the second semiconductor layer; and
    side-etching the patterned second semiconductor layer to locate the edge of the second semiconductor layer away from the edge of the inactivated region and depleting a region of the first semiconductor layer between the edge of the second semiconductor layer and the edge of the inactivated region.

2. The method for fabricating a heterojunction bipolar transistor of claim 1, wherein
    the edge of the inactivated region is 0.1 μm or more away from the edge of the second semiconductor layer.

3. The method for fabricating a heterojunction bipolar transistor of claim 1, wherein
    the first semiconductor layer is made of an InGaP layer.

4. The method for fabricating a heterojunction bipolar transistor of claim 1, wherein
    the step of patterning the second semiconductor layer is carried out by dry etching using a mixed gas of a $SiCl_4$ gas, a $SF_6$ gas and a $N_2$ gas.

5. The method for fabricating a heterojunction bipolar transistor of claim 1, wherein
    the step of patterning the second semiconductor layer is carried out by dry etching using a mixed gas of an Ar gas and a $Cl_2$ gas.

6. The method for fabricating a heterojunction bipolar transistor of claim 1, wherein
    the step of side-etching the patterned second semiconductor layer is carried out by dry etching.

7. The method for fabricating a heterojunction bipolar transistor of claim 6, wherein
    a mixed gas containing a $SiCl_4$ gas and a $SF_6$ gas is used for the dry etching.

8. The method for fabricating a heterojunction bipolar transistor of claim 1, wherein
    the step of side-etching the patterned second semiconductor layer is carried out by wet etching.

9. The method for fabricating a heterojunction bipolar transistor of claim 8, wherein
    an etchant containing phosphoric acid, a hydrogen peroxide solution and water is used for the wet etching.

10. The method for fabricating a heterojunction bipolar transistor of claim 8, wherein
    an etchant containing ammonium citrate, a hydrogen peroxide solution and water is used for the wet etching.

* * * * *